United States Patent
Ikehashi et al.

(10) Patent No.: US 10,763,815 B2
(45) Date of Patent: Sep. 1, 2020

(54) IC CHIP AND METHOD OF DETERMINING A FUSE TO BE CUT OFF

(71) Applicant: KABUSHIKI KAISHA TOSHIBA, Tokyo (JP)

(72) Inventors: Tamio Ikehashi, Kanagawa (JP); Hiroaki Yamazaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/351,844

(22) Filed: Mar. 13, 2019

(65) Prior Publication Data

US 2020/0076394 A1 Mar. 5, 2020

(30) Foreign Application Priority Data

Aug. 28, 2018 (JP) .................................. 2018-159528

(51) Int. Cl.
*H03H 7/38* (2006.01)
*H01L 41/09* (2006.01)
*H01L 41/04* (2006.01)
*H01H 59/00* (2006.01)
*H01L 41/053* (2006.01)
*H01H 37/04* (2006.01)

(52) U.S. Cl.
CPC .............. *H03H 7/38* (2013.01); *H01H 37/04* (2013.01); *H01H 59/00* (2013.01); *H01L 41/042* (2013.01); *H01L 41/0533* (2013.01); *H01L 41/09* (2013.01)

(58) Field of Classification Search
CPC .......... H02H 3/05; H03K 19/003; H03H 7/38; H01H 37/04; H01H 59/00; H01H 41/042; H01H 41/09; H01H 41/0533
USPC .................................................. 327/525, 526
See application file for complete search history.

(56) References Cited

U.S. PATENT DOCUMENTS 6,080,649 A 6/2000 Werner et al.
8,912,841 B1 * 12/2014 Hwang .................. G11C 17/18
327/143

FOREIGN PATENT DOCUMENTS

| JP | S59-121730 A | 7/1984 |
| JP | H5-63090 A | 3/1993 |
| JP | H9-199603 A | 7/1997 |
| JP | 2004-228369 A | 8/2004 |

* cited by examiner

*Primary Examiner* — John W Poos
(74) *Attorney, Agent, or Firm* — Finnegan, Henderson, Farabow, Garrett & Dunner, L.L.P.

(57) ABSTRACT

According to one embodiment, an IC chip includes a plurality of fuse elements including a plurality of fuse portions each of which is to be cut off by a stress, and a plurality of actuator portions provided for the plurality of fuse portions, respectively, and each of which applies a stress to corresponding one of fuse portions, and a control circuit supplying a control signal for cutting off desired one of the fuse portions to corresponding one of the actuator portions.

19 Claims, 10 Drawing Sheets

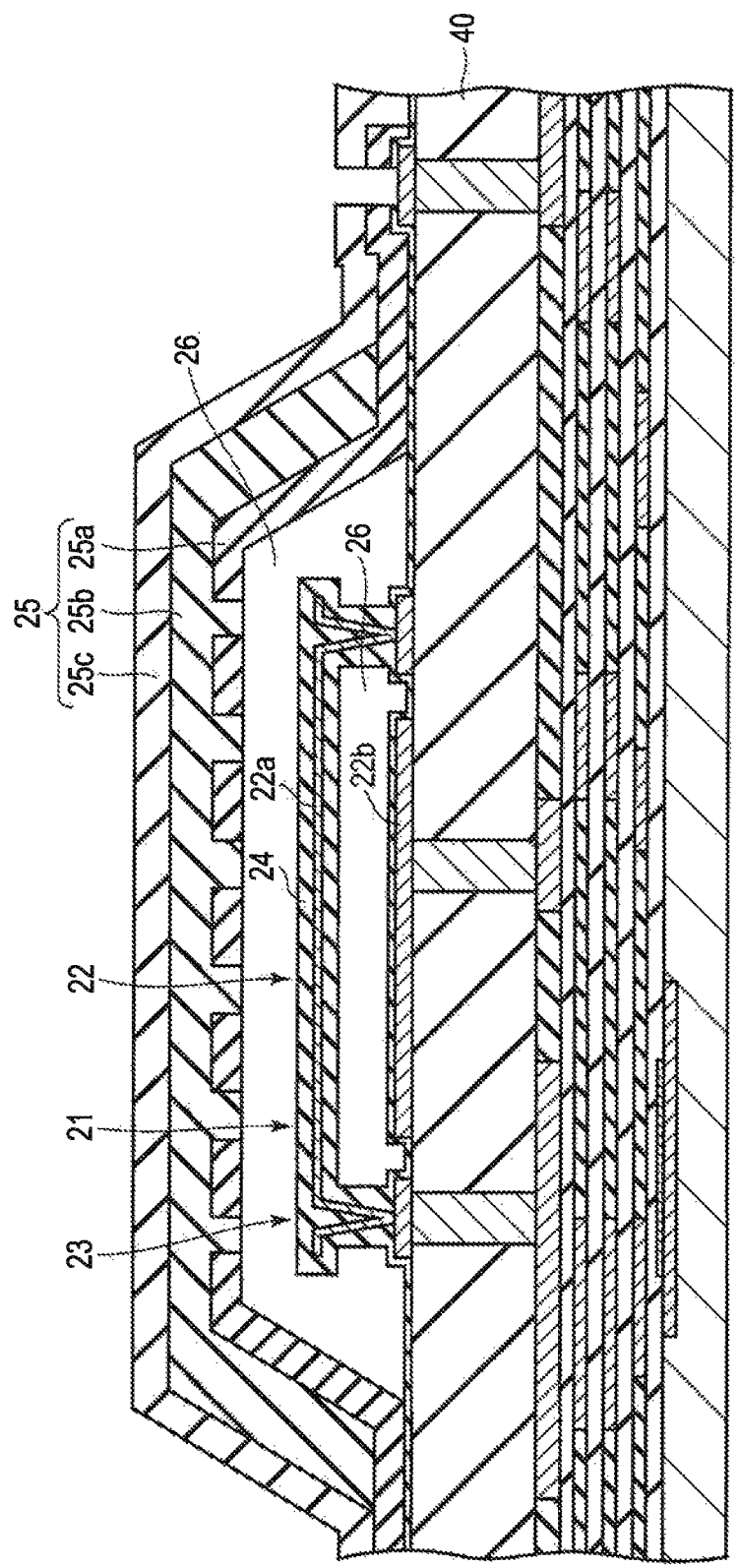
F I G. 5

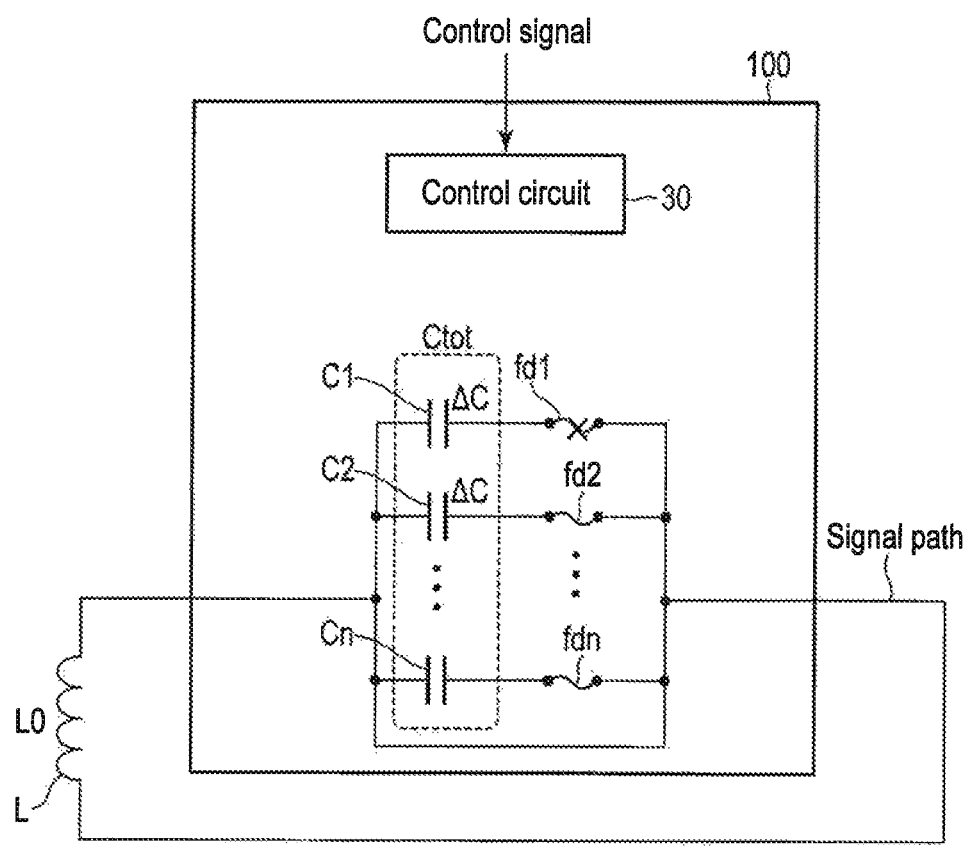
F I G. 14

IC CHIP AND METHOD OF DETERMINING A FUSE TO BE CUT OFF

CROSS-REFERENCE TO RELATED APPLICATIONS

This application is based upon and claims the benefit of priority from Japanese Patent Application No. 2018-159528, filed Aug. 28, 2018, the entire contents of which are incorporated herein by reference.

FIELD

Embodiments described herein relate generally to an IC chip and method of determining a fuse to be cut off.

BACKGROUND

In IC cards and mobile devices, there are some devices configured in such a manner as to receive supply of electric power by wireless power based on magnetic resonance without incorporating batteries in them. Such a device includes an LC oscillator circuit for magnetic resonance. However, when a value of inductance L or capacitance C deviates from a normal value due to production variation or the like, the LC resonance frequency deviates from the normal value. As a result, there is a possibility of sufficient electric power becoming unable to be received.

In order to prevent the above-mentioned problem from occurring, a procedure in which a plurality of impedance elements for trimming configured to tune the values of inductance L and capacitance C are provided and, in the stage of pre-shipment inspection, trimming of inductance L or capacitance C is carried out is effective.

However, heretofore, it could have hardly been said that a device and method making it possible to carry out a trimming operation at low cost and in a simple way have been proposed.

BRIEF DESCRIPTION OF THE DRAWINGS

FIG. 5 is a cross-sectional view schematically showing a configuration example of a fuse element according to the embodiment.

FIG. 14 is a view for explaining the method of estimating a capacitance value according to the embodiment.

DETAILED DESCRIPTION

In general, according to one embodiment, an IC chip includes: a plurality of fuse elements including a plurality of fuse portions each of which is to be cut off by a stress, and a plurality of actuator portions provided for the plurality of fuse portions, respectively, and each of which applies a stress to corresponding one of fuse portions; and a control circuit supplying a control signal for cutting off desired one of the fuse portions to corresponding one of the actuator portions.

Hereinafter, an embodiment will be described with reference to the accompanying drawings.

Figure 1:
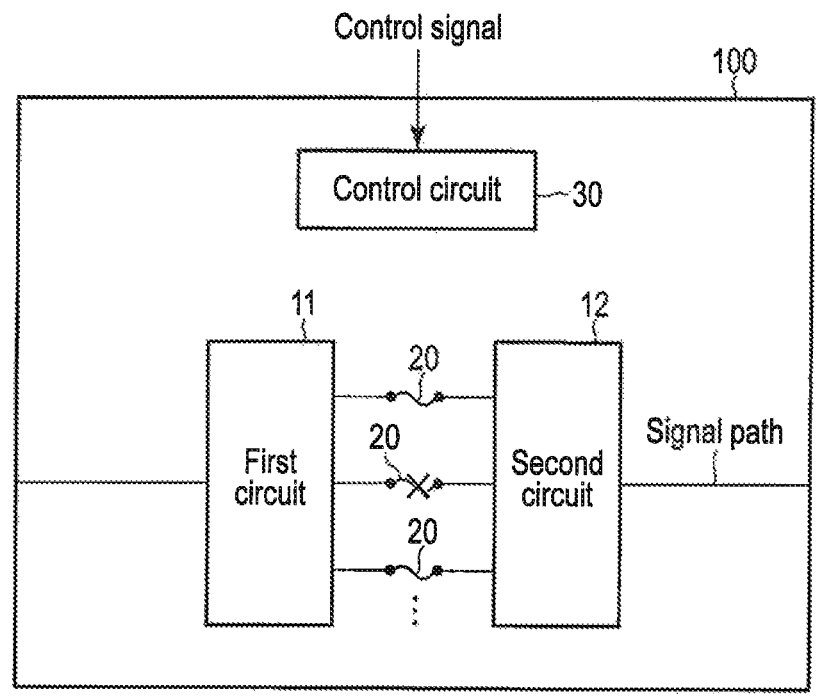
FIG. 1 is a block diagram showing the schematic configuration of an IC chip according to an embodiment.

FIG. 1 is a block diagram showing the schematic configuration of an IC chip according to the embodiment.

An IC chip 100 shown in FIG. 1 is provided with a first circuit 11, second circuit 12, a plurality of fuse elements 20, and control circuit 30.

The first circuit 11 and second circuit 12 are circuits configured to carry out desired circuit operations, and in at least one of the first circuit 11 and second circuit 12, a plurality of impedance elements (inductor elements, capacitor elements) are provided. These impedance elements are elements constituting an LC oscillator circuit for magnetic resonance to be used to receive electric power supply. In the impedance elements, a plurality of impedance elements for tuning (trimming) are included in addition to the main impedance elements.

The plurality of fuse elements 20 are connected to the aforementioned plurality of impedance elements for tuning (trimming). These fuse elements 20 are normally-closed fuse elements and, by cutting off one or more desired fuse elements 20, trimming of the 110 oscillator circuit can be carried out. Normally, of the plurality of fuse portions constituting the plurality of fuse elements, at least one fuse portion has already been cut off, and at least one fuse portion has not been cut off, before shipping the product. The product may already have been equipped with the IC chip 100.

All the impedance values of the plurality of impedance elements for tuning (trimming) connected to the plurality fuse elements 20 may be identical to each other. Alternatively, assuming that the impedance value of an impedance element having the minimum impedance value is Z0, the impedance value of the plurality of impedance elements may be Z0×2n (where n is an integer greater than or equal to 0).

The control circuit 30 is a circuit configured to generate a control signal for cutting off the desired fuse element 20. More specifically, the control circuit 30 generates a control signal for cutting off the desired fuse element 20 on the basis of a control signal supplied thereto from outside.

Figure 2:
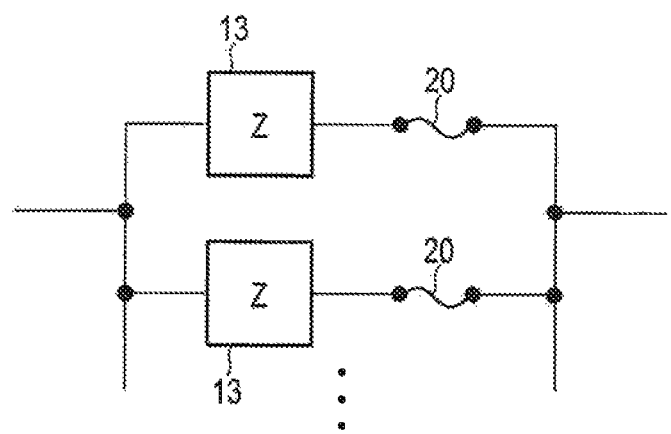
FIG. 2 is a view showing a first connection example of fuse elements according to the embodiment.

FIG. 2 is a view showing a first connection example of the fuse elements 20. In this connection example, the fuse element 20 is connected in series to each of the plurality of impedance elements 13.

Figure 3:
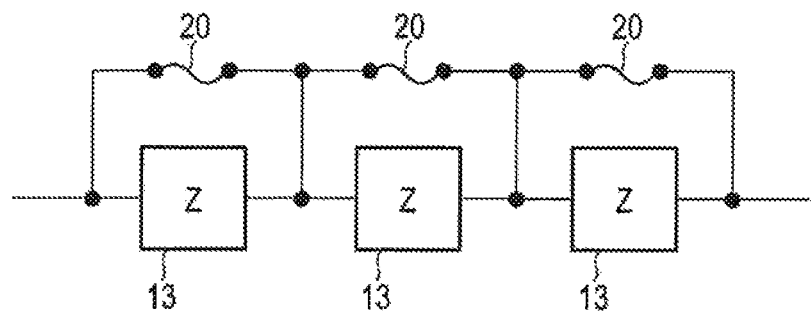
FIG. 3 is a view showing a second connection example of fuse elements according to the embodiment.

FIG. 3 is a view showing a second connection example of the fuse elements 20. In this connection example, the fuse element 20 is connected in parallel to each of the plurality of impedance elements 13.

Figure 4:
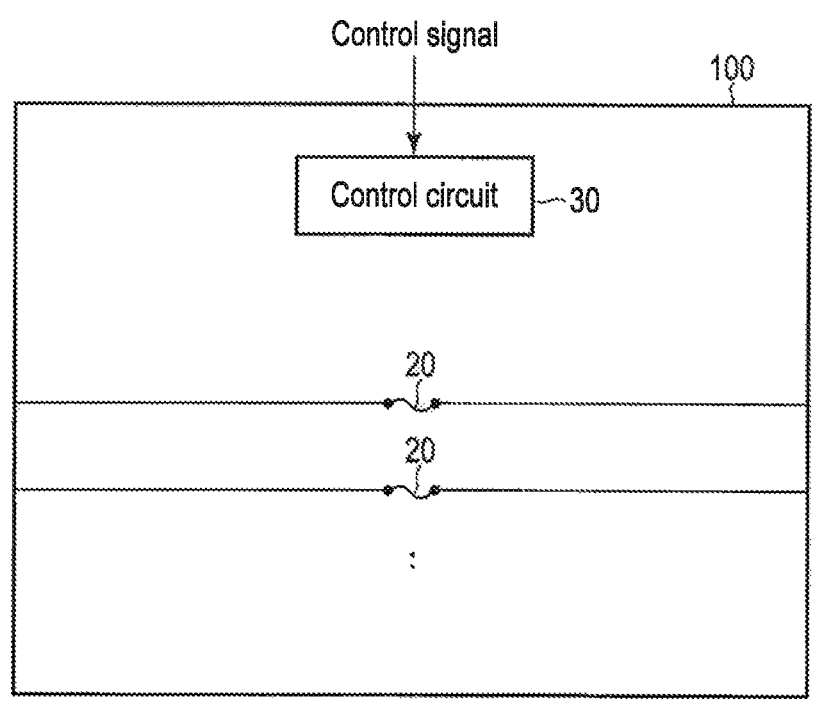
FIG. 4 is a view showing a third connection example of fuse elements according to the embodiment.

FIG. 4 is a view showing a third connection example of the fuse elements 20. In this connection example, although the fuse elements 20 are provided inside the IC chip 100, the impedance elements are provided outside the IC chip 100.

FIG. 5 is a cross-sectional view schematically showing a configuration example of the fuse element 20.

The fuse element 20 is provided on a lower structure 40. In the lower structure 40, a semiconductor substrate, MOS transistor, wiring, and the like are included.

Each fuse element 20 includes a fuse portion 21, actuator portion 22, fixed portion 23, insulating film 24, and protective film 25.

Figure 6:
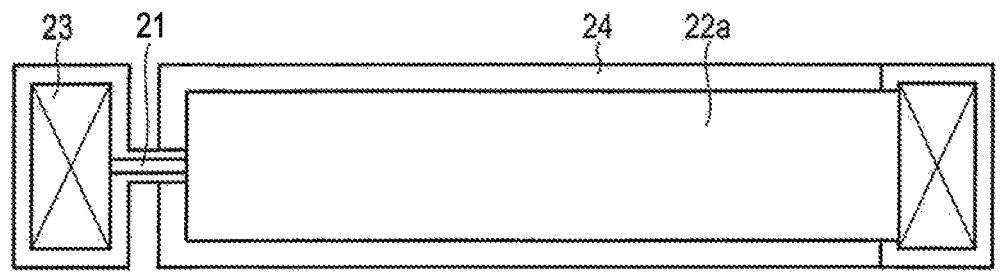
FIG. 6 is a plan view schematically showing a first configuration example of each of a fuse portion, actuator portion, and fixed portion of the fuse element according to the embodiment.

FIG. 6 is a plan view schematically showing a first configuration example of each of the fuse portion 21, actuator portion 22, and fixed portion 23.

The fuse portion 21 is cutoff by a stress applied to the fuse portion 21. It should be noted that in FIG. 5, although a state where the fuse portion 21 is not cut off is shown, of the plurality of fuse portions 21, at least one fuse portion has already been cut off, and at least one fuse portion has not been cut off. The fuse portion 21 is formed of an electric conductor, and is constituted of a nail portion. Both ends of the fuse portion 21 are connected to the actuator portion 22 and fixed portion 23.

The actuator portion 22 is a portion configured to apply a stress to the fuse portion (nail portion) 21, and includes an upper electrode portion (movable electrode portion) 22a and lower electrode portion (fixed electrode portion) 22b both of which facing each other. When a control signal is supplied from the control circuit 30 shown in FIG. 1 to the actuator portion 22, a stress is applied to the fuse portion 21 by the actuator portion 22, and the fuse portion 21 is thereby cut off. More specifically, a voltage is applied between the upper electrode portion 22a and lower electrode portion 22b on the basis of the control signal from the control circuit 30, and electrostatic attractive force acts between the upper electrode portion 22a and lower electrode portion 22b. As a result, the upper electrode portion 22a is displaced. A stress (shearing stress, tensile stress) is applied to the fuse portion 21 by the displacement of the upper electrode portion 22a, and the fuse portion 21 is thereby cut off.

The surfaces of the fuse portion 21, actuator portion 22, and fixed portion 23 are covered with the insulating film 24.

Each fuse portion 21, and each actuator portion 22 are covered with the protective film 25. This protective film 25 has a three-layer structure constituted of a first protective film 25a, second protective film 25b, and third protective film 25c. Inside the protective film 25, a cavity 26 is formed. For this reason, it is possible to securely displace the upper electrode portion 22a, and securely cut off the fuse portion 21.

Figure 7A:
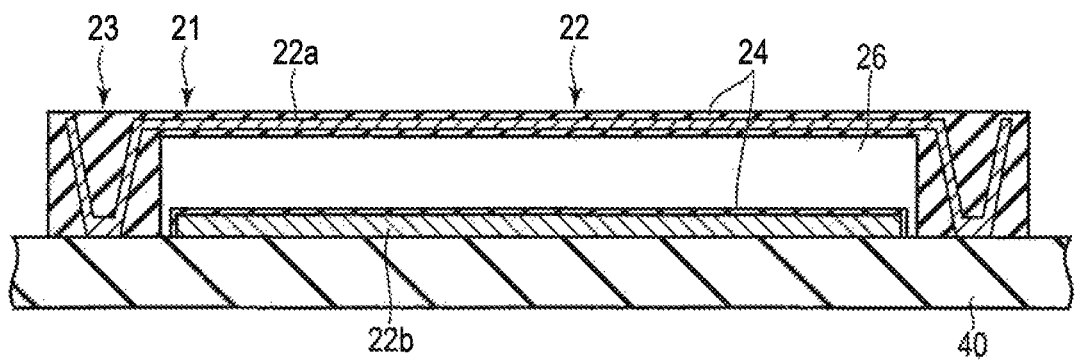
FIGS. 7A, 7B, and 7C are cross-sectional views each schematically showing the state where the fuse portion is cut off by the displacement of the actuator portion according to the embodiment.
Figure 7B:
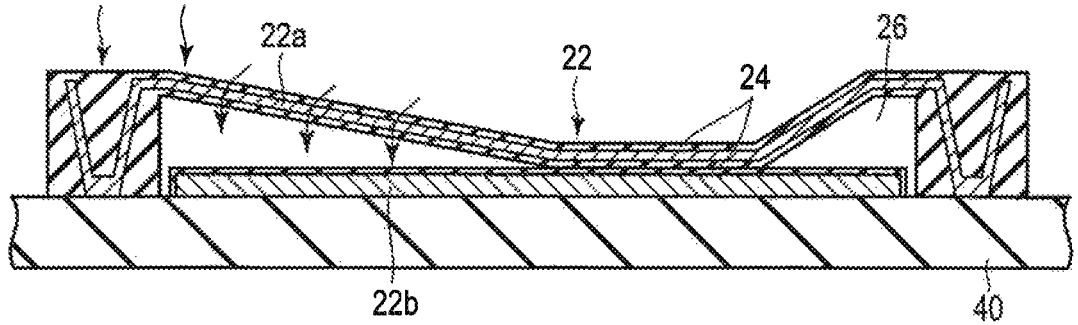
Figure 7C:
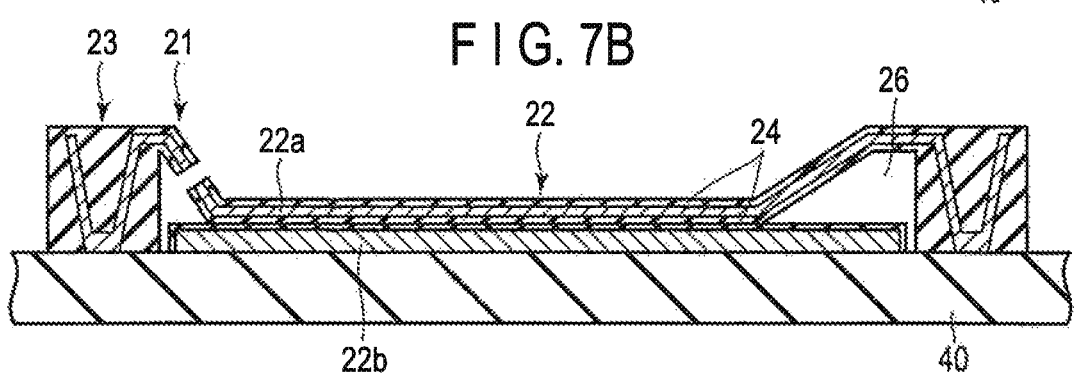

FIGS. 7A to 7C are cross-sectional views each schematically showing the state where the fuse portion 21 is cut off by the displacement of the actuator portion 22.

FIG. 7A shows the state where no voltage is applied between the upper electrode portion 22a and lower electrode portion 22b. When a voltage is applied between the upper electrode portion 22a and lower electrode portion 22b, the upper electrode portion 22a is downwardly pulled in at a part thereof having less spring force as shown in FIG. 7B. When the voltage is further increased, the pulled-in part comes closer to the fuse portion 21. As a result, as shown in FIG. 7C, a large stress is applied to the fuse portion 21, and the fuse portion 21 is thereby cut off. By providing a part having small spring force in the upper electrode portion 22, it is possible to reduce the applied voltage for pulling-in. It is also sufficient if pulling-in is facilitated by providing a part at which the distance between the upper electrode portion 22a and lower electrode portion 22b is smaller. For example, by warping the upper electrode portion 22a, it is possible to provide a part at which the distance between the upper electrode portion 22a and lower electrode portion 22b is smaller.

It should be noted that in the configuration of the fuse element 20 described above, it is necessary to contrive ways to prevent the fuse portion 21 from being broken by the external impact. For that purpose, assuming that the force to be applied from the actuator portion 22 to the fuse portion 21 when the fuse portion 21 is to be cut off is Fa, shear strength of the fuse portion 21 is Fc, and maximum value of impulsive force at the time of actual use is Fg, it is desirable that the following condition be satisfied.

$$Fa > Fc > Fg$$

Assuming that the effective mass of the upper electrode portion 22a is M, and maximum acceleration at the time when the impact is made is Gmax, the following formula is obtained.

$$Fg = M \times Gmax$$

Regarding the value of Gmax, it is sufficient if, for example, about 10000 g is employed as a rough standard thereof.

Figure 8:
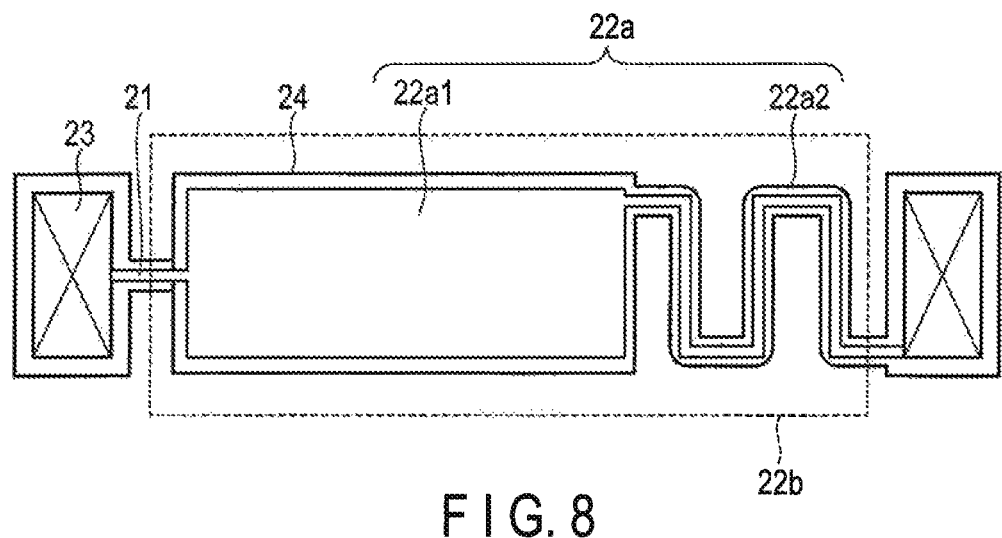
FIG. 8 is a plan view schematically showing a second configuration example of each of the fuse portion, actuator portion, and fixed portion of the fuse element according to the embodiment.
Figure 9:
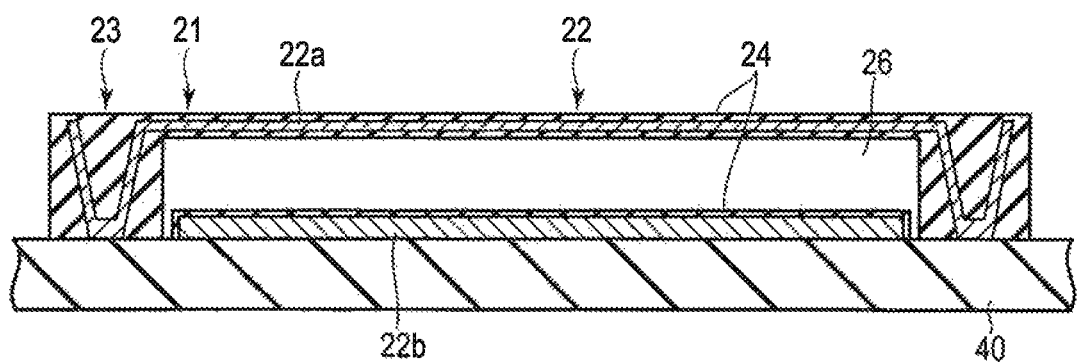
FIG. 9 is a cross-sectional view schematically showing the second configuration example of each of the fuse portion, actuator portion, and fixed portion of the fuse element according to the embodiment.

FIG. 8 is a plan view schematically showing a second configuration example of each of the fuse portion 21, actuator portion 22, and fixed portion 23. FIG. 9 is a cross-sectional view schematically showing the second configuration example of each of the fuse portion 21, actuator portion 22, and fixed portion 23.

In this configuration example, the upper electrode portion 22a of the actuator portion 22 is constituted of a rectangular portion 22a1 and thin line portion 22a2. The thin line portion 22a2 has a shape of a broken line, and has weak spring force. By providing the thin line portion 22a2 having a shape of a broken line as described above, it is possible to easily downwardly pull in the upper electrode portion 22a.

Figure 10:
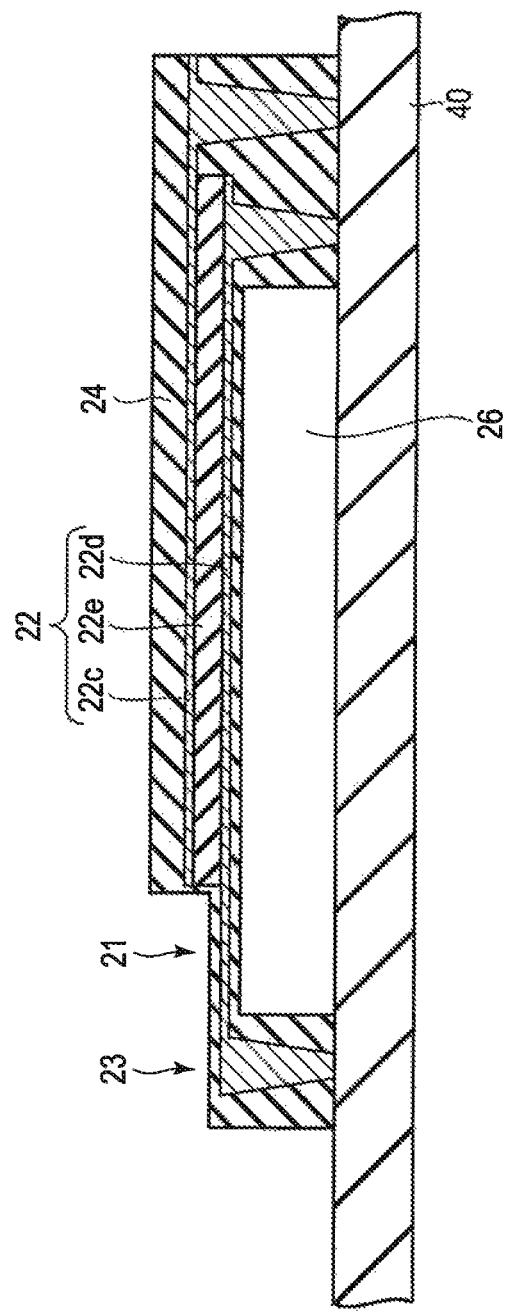
FIG. 10 is a cross-sectional view schematically showing a third configuration example of each of the fuse portion, actuator portion, and fixed portion of the fuse element according to the embodiment.

FIG. 10 is a cross-sectional view schematically showing a third configuration example of each of the fuse portion 21, actuator portion 22, and fixed portion 23.

In this configuration example, the actuator portion 22 is constituted of a piezoelectric actuator portion, and is configured in such a manner as to apply a stress to the fuse portion 21 on the basis of the displacement of the piezoelectric actuator portion caused by the piezoelectric force. More specifically, a piezoelectric film 22e is sandwiched between an electrode portion 22c and electrode portion 22d and, when a voltage is applied between the electrode portion 22c and electrode portion 22d, the piezoelectric film 22e contracts, whereby the electrode portion 22c, electrode portion 22d, and piezoelectric film 22e are downwardly displaced. As a result, a stress is applied to the fuse portion (nail portion) 21 and the fuse portion is thereby cut off.

Figure 11:
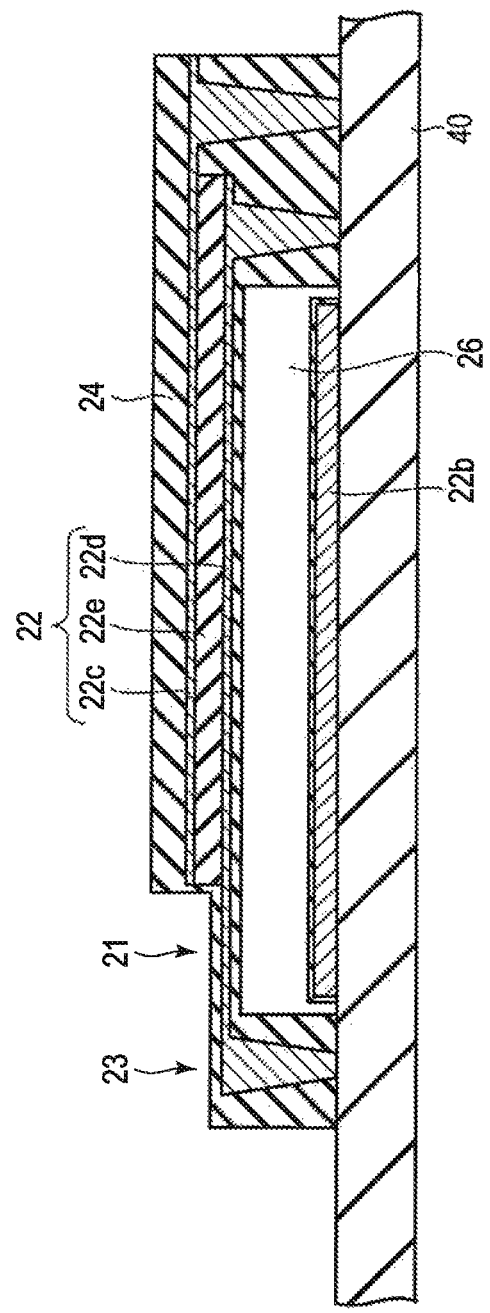
FIG. 11 is a cross-sectional view schematically showing a fourth configuration example of each of the fuse portion, actuator portion, and fixed portion of the fuse element according to the embodiment.

FIG. 11 is a cross-sectional view schematically showing a fourth configuration example of each of the fuse portion 21, actuator portion 22, and fixed portion 23.

This configuration example corresponds to a combination of the aforementioned first configuration example and third configuration example. That is, in this configuration example, by applying a voltage between the electrode portion 22c and electrode portion 22d, the piezoelectric film 22e is made to contract, and the electrode portion 22d and the like are displaced by the electrostatic attractive force resulting from the potential difference between the electrode portion 22b and electrode portion 22d. As a result, a stress is applied to the fuse portion (nail portion) 21, whereby the fuse portion 21 is cut off.

Figure 12:
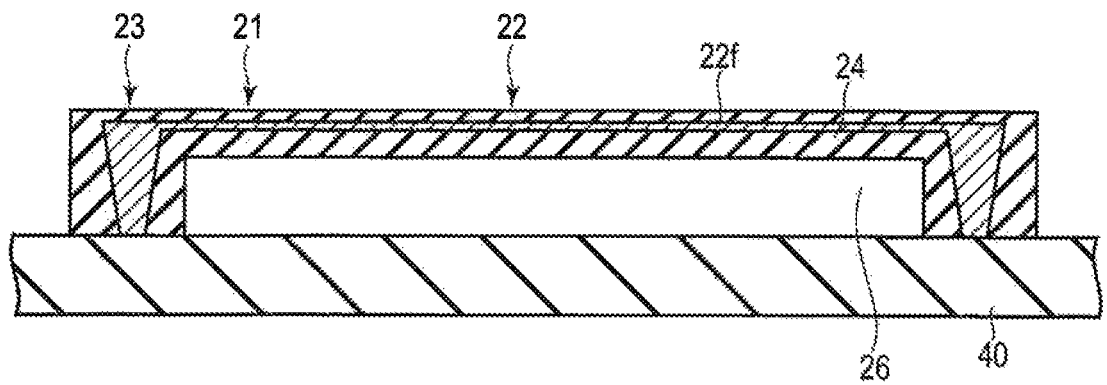
FIG. 12 is a cross-sectional view schematically showing a fifth configuration example of each of the fuse portion, actuator portion, and fixed portion of the fuse element according to the embodiment.

FIG. 12 is a cross-sectional view schematically showing a fifth configuration example of each of the fuse portion 21, actuator portion 22, and fixed portion 23.

In this configuration example, the actuator portion 22 includes a heater portion 22f, and the configuration is contrived in such a manner as to apply a stress to the fuse portion 21 on the basis of the displacement of the heater portion 22f caused by the heat generated by the heater portion 22f. More specifically, the heater portion 22f is constituted of metallic wiring and, Joule heat is generated by making an electric current flow through the heater portion 22f. The coefficient of thermal expansion of the heater portion 22f is greater than the coefficient of thermal expansion of the insulating film 24 surrounding the heater portion 22f, and hence the heater portion 22f and the like are downwardly displaced by the bimorph effect. As a result, a stress is applied to the fuse portion (nail portion) 21, whereby the fuse portion 21 is cut off.

As described above, according to this embodiment, the plurality of fuse elements 20 are provided inside the IC chip 100, each of the fuse elements 20 is constituted of the fuse portion 21, actuator portion 22, and the like, and the fuse portion 21 is cut off by the stress based on the displacement of the actuator portion 22. Accordingly, by connecting the impedance element to each of the plurality of fuse portions 21, it becomes possible to carry out trimming of impedance at low cost and in a simple way.

Incidentally, when tuning (trimming) of the impedance of the resonance circuit is carried out by using a capacitor element as the impedance element for trimming, if the capacitor element is once disconnected from the resonance circuit by cutting off the fuse, the disconnected capacitor element cannot be incorporated again into the resonance circuit. In order to prevent such a problem from occurring, it is sufficient if the total capacitance value of the capacitor element to be disconnected can be estimated in advance. Hereinafter, the method of estimating the capacitance value will be described.

Figure 13:
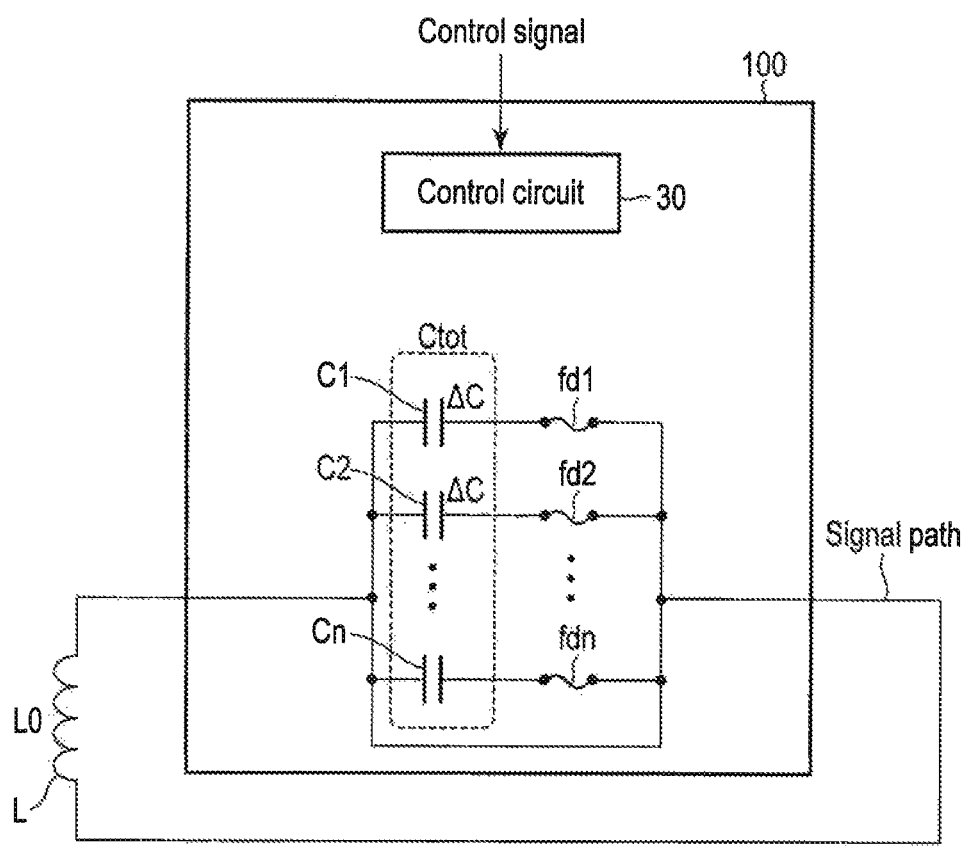
FIG. 13 is a view for explaining the method of estimating a capacitance value according to the embodiment.
Figure 15:
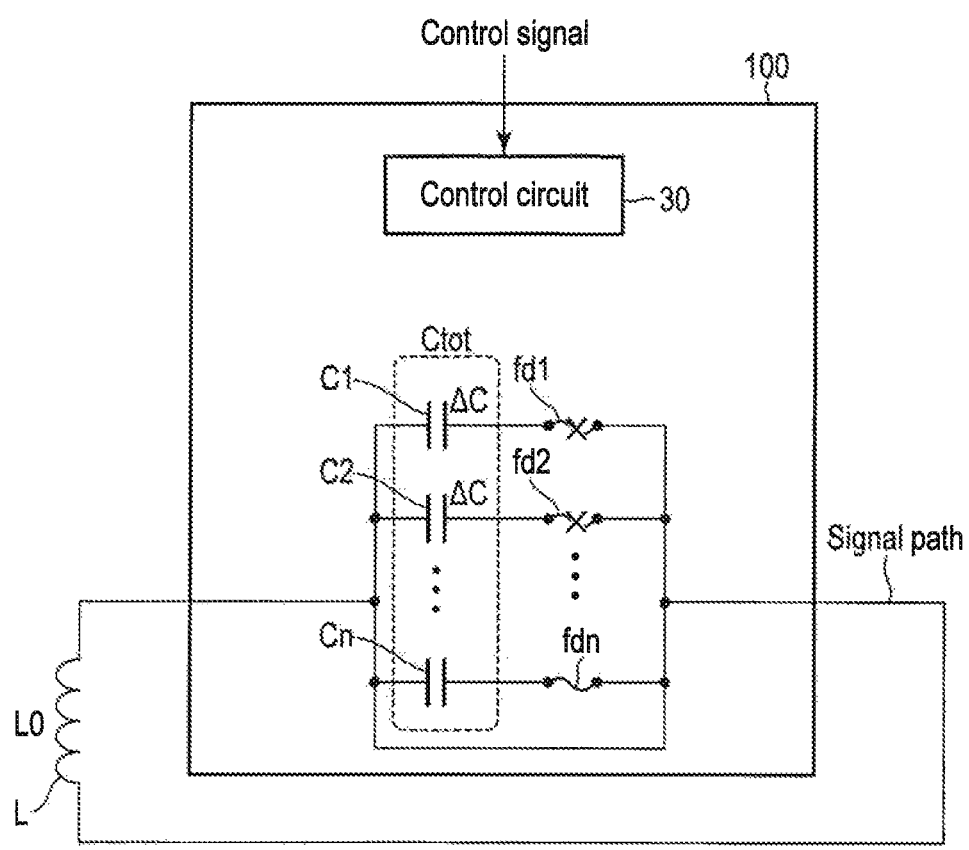
FIG. 15 is a view for explaining the method of estimating a capacitance value according to the embodiment.

FIGS. 13 through 15 are views for explaining the method of estimating the capacitance value.

First, as shown in FIG. 13, an IC chip 100 provided with a plurality of impedance elements (capacitor elements) C1 to Cn, a plurality of fuse portions (fuse elements) fd1 to fdn, and control circuit 30 is prepared.

The plurality of impedance elements C1 to Cn include a first impedance element C1 and second impedance element C2 having the same impedance value. The impedance elements C1 to Cn are capacitor elements and constitute a resonance circuit (LC resonance circuit) together with an inductor element L. It should be noted that in the example of FIG. 13, although the inductor element L is provided outside the IC chip 100, the inductor element L may be provided inside the IC chip 100.

The plurality of fuse portions fd1 to fdn are respectively connected to the plurality of impedance elements C1 to Cn. The plurality of fuse portions fd1 to fdn include a first fuse portion fd1 connected to the first impedance element C1, and second fuse portion fd2 connected to the second impedance element C2. As the fuse portions fd1 to fdn, the fuse elements described in the aforementioned embodiment can be used. It should be noted that as the fuse portions fd1 to fdn, fuse elements to be burned out by heat may also be used.

The control circuit 30 is a circuit configured to generate a control signal for cutting off a desired fuse portion of the fuse portions fd1 to fdn.

In the step of FIG. 13, the initial resonance frequency of the LC resonance circuit is obtained in the state where the first impedance element C1 and second impedance element C2 are connected to the circuit. Assuming that the total impedance (capacitance) of the impedance elements C1 to Cn is C0, impedance (inductance) of the inductor element. L is L0, and resonance angular frequency of the LC resonance circuit is ω0, the following formula is obtained.

$$\omega 0^2 = 1/(L0C0) \quad \text{(formula 1)}$$

Next, as shown in FIG. 14, the first fuse portion fd1 is cut off. Thereby, the first impedance element C1 is disconnected from the LC resonance circuit. The impedance (capacitance) of the first impedance element C1 is assumed to be ΔC. Assuming that the resonance angular frequency of the LC resonance circuit from which the first impedance element C1 is disconnected is ω1, the following formula is obtained.

$$\omega 1^2 = 1/L0(C0-\Delta C)) \quad \text{(formula 2)}$$

Next, as shown in FIG. 15, the second fuse portion fd2 is cut off. Thereby, the second impedance element C2 is disconnected from the LC resonance circuit. As a result, the state where both the first impedance element C1 and second impedance element C2 are disconnected from the LC resonance circuit is brought about. The impedance (capacitance) of each of the first impedance element C1 and second impedance element C2 is ΔC. Accordingly, the resonance angular frequency ω2 of the LC resonance circuit from which the first impedance element C1 and second impedance element C2 are disconnected is expressed by the following formula.

$$\omega 2^2 = 1/L0(C0-2\Delta C)) \quad \text{(formula 3)}$$

The values of ω0, ω1, and ω2 can be measured, and hence it is possible to estimate the values of L0, C0, and ΔC from the above (formula 1), (formula 2), and (formula 3). In this way, the values of L0, C0, and ΔC are obtained, whereby the capacitance value C for realizing the desired resonance angular frequency ω can be obtained. One or more impedance elements of the impedance elements C3 to Cn are disconnected from the LC resonance circuit so that the capacitance value C obtained in this way can be obtained. That is, one or more fuse portions of the fuse portions fd3 to fdn are cut off.

As can be seen from the above description, when the above-mentioned method of determining a fuse to be cut off is used, the first fuse portion fd1 and second fuse portion fd2 are finally cut off, and the first impedance element C1 and second impedance element C2 are disconnected from the LC resonance circuit.

By using the above-mentioned method of determining a fuse to be cut off, it becomes possible to carry out the trimming operation securely and in a simple way.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An IC chip comprising:
a plurality of fuse elements including a plurality of fuse portions, each of which is to be cut off by a stress, a plurality of actuator portions provided for the plurality of fuse portions, respectively, each of which applies a stress to corresponding one of the fuse portions, and a plurality of fixed portions; and
a control circuit supplying a control signal for cutting off desired one of the fuse portions to corresponding one of the actuator portions, wherein
each of the fuse portions is provided between corresponding one of the actuator portions and corresponding one of the fixed portions.

2. The IC chip of claim 1, wherein
at least one of the fuse portions has already been cut off.

3. The IC chip of claim 1, wherein
at least one of the fuse portions has not been cut off.

4. The IC chip of claim 1, wherein
each of the actuator portions includes electrode portions facing each other, and applies a stress to corresponding one of the fuse portions on the basis of displacement of the electrode portions caused by an electrostatic attractive force acting between the electrode portions.

5. The IC chip of claim 1, wherein
each of the actuator portions includes a piezoelectric actuator portion, and applies a stress to corresponding one of the fuse portions on the basis of displacement of the piezoelectric actuator portion caused by piezoelectric force of the piezoelectric actuator portion.

6. The IC chip of claim 1, wherein
each of the actuator portions includes a heater portion, and applies a stress to corresponding one of the fuse portions on the basis of displacement of the heater portion caused by heat generated by the heater portion.

7. The IC chip of claim 1, wherein
the plurality of fuse portions are provided for a plurality of impedance elements, and one end of each of the fuse portions is electrically connected to corresponding one of the impedance elements.

8. The IC chip of claim 1, wherein
the plurality of fuse elements further include a plurality of protective films, and
each of the protective films covers corresponding one of the fuse portions and corresponding one of the actuator portions, and form a cavity inside.

9. The IC chip of claim 1, further comprising a plurality of impedance elements including a first impedance element and a second impedance element both of which have a same impedance value, wherein
the plurality of fuse portions include a first fuse portion one end of which is electrically connected to the first impedance element and which has already been cut off, and a second fuse portion one end of which is electrically connected to the second impedance element and which has already been cut off.

10. A method of determining a fuse to be cut off, comprising:

preparing an IC chip, the IC chip including:
a plurality of impedance elements constituting a resonance circuit and including a first impedance element and a second impedance element both of which have a same impedance value;
a plurality of fuse portions including a first fuse portion electrically connected to the first impedance element and a second fuse portion electrically connected to the second impedance element; and
a control circuit generating a control signal for cutting off desired one of the fuse portions;
obtaining an initial resonance frequency of the resonance circuit to which the first impedance element and the second impedance element are electrically connected;
obtaining a first resonance frequency of the resonance circuit from which the first impedance element is electrically disconnected by cutting off the first fuse portion;
obtaining a second resonance frequency of the resonance circuit from which the first impedance element and the second impedance element are electrically disconnected by cutting off the first fuse portion and the second fuse portion; and
determining one or more of the fuse portions to be cut off on the basis of the initial resonance frequency, the first resonance frequency and the second resonance frequency.

11. An IC chip comprising:
a plurality of fuse elements including a plurality of fuse portions, each of which is to be cut off by a stress, and a plurality of movable actuator portions provided for the plurality of fuse portions, respectively; and
a control circuit supplying a control signal for cutting off desired one of the fuse portions to corresponding one of the actuator portions, wherein
each of the fuse portions is capable of being cut off by a mechanical stress which is applied based on a movement of corresponding one of the actuator portions.

12. The IC chip of claim 11, wherein
at least one of the fuse portions has already been cut off.

13. The IC chip of claim 11, wherein
at least one of the fuse portions has not been cut off.

14. The IC chip of claim 11, wherein
each of the actuator portions includes electrode portions facing each other, and applies a stress to corresponding one of the fuse portions on the basis of displacement of the electrode portions caused by an electrostatic attractive force acting between the electrode portions.

15. The IC chip of claim 11, wherein
each of the actuator portions includes a piezoelectric actuator portion, and applies a stress to corresponding one of the fuse portions on the basis of displacement of the piezoelectric actuator portion caused by piezoelectric force of the piezoelectric actuator portion.

16. The IC chip of claim 11, wherein
each of the actuator portions includes a heater portion, and applies a stress to corresponding one of the fuse portions on the basis of displacement of the heater portion caused by heat generated by the heater portion.

17. The IC chip of claim 11, wherein
the plurality of fuse portions are provided for a plurality of impedance elements, and one end of each of the fuse portions is electrically connected to corresponding one of the impedance elements.

18. The IC chip of claim 11, wherein
the plurality of fuse elements further include a plurality of protective films, and each of the protective films covers corresponding one of the fuse portions and corresponding one of the actuator portions, and form a cavity inside.

19. The IC chip of claim 11, further comprising a plurality of impedance elements including a first impedance element and a second impedance element both of which have a same impedance value, wherein
 the plurality of fuse portions include a first fuse portion one end of which is electrically connected to the first impedance element and which has already been cut off, and a second fuse portion one end of which is electrically connected to the second impedance element and which has already been cut off.

\* \* \* \* \*